United States Patent
Lea et al.

(10) Patent No.: US 11,340,983 B2
(45) Date of Patent: May 24, 2022

(54) ERROR CODE CALCULATION ON SENSING CIRCUITRY

(71) Applicant: Micron Technology, Inc., Boise, ID (US)

(72) Inventors: Perry V. Lea, Eagle, ID (US); Timothy P. Finkbeiner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/201,970

(22) Filed: Mar. 15, 2021

(65) Prior Publication Data

US 2021/0200636 A1 Jul. 1, 2021

Related U.S. Application Data

(63) Continuation of application No. 16/575,061, filed on Sep. 18, 2019, now Pat. No. 10,949,299, which is a
(Continued)

(51) Int. Cl.
*G06F 11/10* (2006.01)
*G06F 12/00* (2006.01)
(Continued)

(52) U.S. Cl.
CPC .......... *G06F 11/1068* (2013.01); *G06F 3/064* (2013.01); *G06F 3/0619* (2013.01);
(Continued)

(58) Field of Classification Search
CPC .... G06F 11/1068; G06F 3/0619; G06F 3/064; G06F 3/0679; G06F 11/1004;
(Continued)

(56) References Cited

U.S. PATENT DOCUMENTS 4,380,046 A 4/1983 Fung
4,435,792 A 3/1984 Bechtolsheim
(Continued)

FOREIGN PATENT DOCUMENTS

CN 102141905 8/2011
EP 0214718 3/1987
(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.
(Continued)

*Primary Examiner* — John J Tabone, Jr.
(74) *Attorney, Agent, or Firm* — Brooks, Cameron & Huebsch, PLLC

(57) ABSTRACT

Examples of the present disclosure provide apparatuses and methods for error code calculation. The apparatus can include an array of memory cells that are coupled to sense lines. The apparatus can include a controller configured to control a sensing circuitry, that is coupled to the sense lines, to perform a number of operations without transferring data via an input/output (I/O) lines. The sensing circuitry can be controlled to calculate an error code for data stored in the array of memory cells and compare the error code with an initial error code for the data to determine whether the data has been modified.

20 Claims, 8 Drawing Sheets

Related U.S. Application Data continuation of application No. 16/212,513, filed on Dec. 6, 2018, now Pat. No. 10,423,486, which is a continuation of application No. 15/959,978, filed on Apr. 23, 2018, now Pat. No. 10,152,374, which is a continuation of application No. 14/989,264, filed on Jan. 6, 2016, now Pat. No. 9,952,925.

(51) Int. Cl.

| | | |
|---|---|---|
| G11C 7/10 | (2006.01) | |
| G11C 7/06 | (2006.01) | |
| G11C 7/12 | (2006.01) | |
| G11C 11/4096 | (2006.01) | |
| G11C 11/4091 | (2006.01) | |
| G06F 3/06 | (2006.01) | |
| G11C 29/52 | (2006.01) | |
| H03M 13/09 | (2006.01) | |
| G11C 29/46 | (2006.01) | |

(52) U.S. Cl.
CPC ........ *G06F 3/0679* (2013.01); *G06F 11/1004* (2013.01); *G06F 11/1048* (2013.01); *G06F 12/00* (2013.01); *G11C 7/06* (2013.01); *G11C 7/062* (2013.01); *G11C 7/1006* (2013.01); *G11C 7/106* (2013.01); *G11C 7/1048* (2013.01); *G11C 7/1087* (2013.01); *G11C 7/12* (2013.01); *G11C 11/4091* (2013.01); *G11C 11/4096* (2013.01); *G11C 29/52* (2013.01); *H03M 13/09* (2013.01); *G11C 29/46* (2013.01)

(58) Field of Classification Search
CPC .... G06F 11/1048; G06F 12/00; H03M 13/09; G11C 29/52; G11C 7/06; G11C 7/1087; G11C 7/1006; G11C 7/1048; G11C 11/4091; G11C 11/4096; G11C 7/12; G11C 7/062; G11C 29/46
USPC ....... 714/807, 763, 768, 773, 799, 718, 719; 365/201, 189.07, 203, 208, 185.21, 365/185.22, 185.09, 205
See application file for complete search history.

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,310,818 B1 | 10/2001 | Mukai |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Fran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,543,216 B1 | 6/2009 | Plants |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |

(56) References Cited

U.S. PATENT DOCUMENTS

| | | |
|---|---|---|
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,522,126 B1 * | 8/2013 | Chen .................. G06F 11/004 714/807 |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Gullag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 * | 2/2015 | Manning ............. G11C 11/4091 365/201 |
| 8,971,124 B1 * | 3/2015 | Manning ................. G11C 7/06 365/185.21 |
| 9,015,390 B2 | 4/2015 | Klein |
| 9,047,193 B2 | 6/2015 | Lin et al. |
| 9,081,698 B2 | 7/2015 | Nicholes |
| 9,165,023 B2 | 10/2015 | Moskovich et al. |
| 9,318,220 B2 * | 4/2016 | Shen .................. G11C 16/3418 |
| 9,552,257 B2 * | 1/2017 | Shen ..................... G11C 16/10 |
| 9,558,063 B2 * | 1/2017 | Kajigaya ............ G06F 11/1044 |
| 9,952,925 B2 * | 4/2018 | Lea .................... G06F 11/1048 |
| 10,152,374 B2 * | 12/2018 | Lea .................... G06F 11/1004 |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0038919 A1 * | 2/2007 | Sekiguchi ........... G06F 11/1044 714/763 |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0195894 A1 * | 8/2008 | Schreck ................ G06F 11/106 714/34 |
| 2008/0215937 A1 | 9/2008 | Dreibelbis et al. |
| 2008/0270834 A1 | 10/2008 | Liu |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2009/0316501 A1 * | 12/2009 | Bunker ................ G06F 11/1068 365/189.17 |
| 2010/0067296 A1 | 3/2010 | Li |
| 2010/0091582 A1 | 4/2010 | Vali et al. |
| 2010/0122146 A1 | 5/2010 | Nazarian et al. |
| 2010/0162065 A1 | 6/2010 | Norman |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2012/0324321 A1 | 12/2012 | Chowdhury et al. |
| 2013/0003467 A1 | 1/2013 | Klein |
| 2013/0051143 A1 * | 2/2013 | Shen .................... G06F 11/1004 365/185.09 |
| 2013/0058168 A1 * | 3/2013 | Shen ..................... G11C 16/34 365/185.18 |

(56) References Cited

U.S. PATENT DOCUMENTS

| | | |
|---|---|---|
| 2013/0061006 A1 | 3/2013 | Hein |
| 2013/0082736 A1 | 4/2013 | Dono |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0026016 A1 | 1/2014 | Nicholes |
| 2014/0185395 A1 | 7/2014 | Seo |
| 2014/0215185 A1 | 7/2014 | Danielsen |
| 2014/0233314 A1* | 8/2014 | Shen ............ G11C 16/26 365/185.09 |
| 2014/0250279 A1* | 9/2014 | Manning ............ G11C 7/1006 711/154 |
| 2014/0344934 A1 | 11/2014 | Jorgensen |
| 2015/0029798 A1* | 1/2015 | Manning ............ G11C 7/1048 365/189.07 |
| 2015/0042380 A1* | 2/2015 | Manning ............ G06F 3/0611 326/38 |
| 2015/0063052 A1* | 3/2015 | Manning ............ G06F 12/0246 365/230.01 |
| 2015/0074493 A1* | 3/2015 | Kajigaya ............ G11C 11/1673 714/764 |
| 2015/0078108 A1* | 3/2015 | Cowles ............ G11C 7/1036 365/189.12 |
| 2015/0120987 A1* | 4/2015 | Wheeler ............ G11C 7/1006 711/102 |
| 2015/0134713 A1* | 5/2015 | Wheeler ............ G06F 5/01 708/209 |
| 2015/0178187 A1 | 6/2015 | Sheffler et al. |
| 2015/0270015 A1 | 9/2015 | Murphy et al. |
| 2015/0279466 A1* | 10/2015 | Manning ............ G11C 15/043 365/49.17 |
| 2015/0324290 A1 | 11/2015 | Leidel |
| 2015/0325272 A1 | 11/2015 | Murphy |
| 2015/0356009 A1* | 12/2015 | Wheeler ............ G11C 7/1006 711/170 |
| 2015/0356022 A1* | 12/2015 | Leidel ............ G06F 12/1009 711/207 |
| 2015/0357007 A1 | 12/2015 | Manning et al. |
| 2015/0357008 A1* | 12/2015 | Manning ............ G11C 11/4093 365/189.15 |
| 2015/0357019 A1* | 12/2015 | Wheeler ............ G11C 7/1006 365/189.05 |
| 2015/0357020 A1* | 12/2015 | Manning ............ G11C 11/4091 365/189.08 |
| 2015/0357021 A1* | 12/2015 | Hush ............ G11C 7/065 365/72 |
| 2015/0357022 A1* | 12/2015 | Hush ............ G11C 7/1012 365/72 |
| 2015/0357023 A1* | 12/2015 | Hush ............ G11C 7/1012 365/189.011 |
| 2015/0357024 A1* | 12/2015 | Hush ............ G11C 7/1012 365/72 |
| 2015/0357047 A1* | 12/2015 | Tiwari ............ G06F 9/3877 714/719 |
| 2017/0117044 A1* | 4/2017 | Kajigaya ............ G06F 11/1028 |
| 2017/0192844 A1* | 7/2017 | Lea ............ G11C 7/1006 |
| 2018/0239672 A1* | 8/2018 | Lea ............ G11C 7/1087 |
| 2019/0108094 A1* | 4/2019 | Lea ............ G06F 11/1068 |
| 2020/0012562 A1* | 1/2020 | Lea ............ G06F 11/1068 |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| TW | 201517047 | 5/2015 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

"4.9 3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-in-Memory Chip," Jun. 22-26, 2002, (12 pgs.), ICS '02, retrieved from: http://www.isi.edu/~draper/papers/ics02.pdf.

Adibi, et al., "Processing-in-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs ).

U.S. Appl. No. 13/743,686, entitled, "Weighted Search and Compare in a Memory Device," filed Jan. 17, 2013, (25 pgs).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for related PCT Patent Application No. PCT/US2017/012240, dated Apr. 24, 2017, 13 pages.

Extended European Search Report and Written Opinion for related EP Application No. 17736285.2, dated Jul. 23, 2019, 8 pages.

(56) References Cited

OTHER PUBLICATIONS

Extended European Search Report for related EP Application No. 21164080.0, dated Jun. 14, 2021, 6 pages.

* cited by examiner

| 444 | 445 | 456 | 470 | 471 |
|---|---|---|---|---|
| A | B | NOT OPEN | OPEN TRUE | OPEN INVERT |
| 0 | 0 | 0 | 0 | 1 |
| 0 | 1 | 0 | 1 | 0 |
| 1 | 0 | 1 | 0 | 1 |
| 1 | 1 | 1 | 1 | 0 |

475 →

|  |  | 476 / 477 / 478 / 479 → 480 |  |  |  |  |  |  |  |  |
|---|---|---|---|---|---|---|---|---|---|---|
| FF |  | 0 | 0 | 0 | 0 | 0 | 0 | 1 | 1 | 1 |
| FT |  | 0 | 0 | 0 | 1 | 1 | 1 | 0 | 0 | 0 |
| TF |  | 0 | 0 | 1 | 0 | 0 | 1 | 0 | 0 | 1 |
| TT |  | 0 | 1 | 0 | 0 | 1 | 0 | 0 | 1 | 0 |
| A | B | A | A*B | A*B̄ | A+B | B | AXB | A+B̄ | ĀXB | B̄ |
| 0 | 0 | 0 | 0 | 0 | 0 | 0 | 0 | 1 | 1 | 1 |
| 0 | 1 | 0 | 0 | 0 | 1 | 1 | 1 | 0 | 0 | 0 |
| 1 | 0 | 1 | 0 | 1 | 1 | 0 | 1 | 1 | 0 | 1 |
| 1 | 1 | 1 | 1 | 0 | 1 | 1 | 0 | 1 | 1 | 0 |

(header row labeled 447)

*Fig. 4*

ERROR CODE CALCULATION ON SENSING CIRCUITRY

PRIORITY INFORMATION

This application is a Continuation of U.S. application Ser. No. 16/575,061, filed Sep. 18, 2019, which issues as U.S. Pat. No. 10,949,299 on Mar. 16, 2021, which is a Continuation of U.S. application Ser. No. 16/212,513, filed Dec. 6, 2018, which issues as U.S. Pat. No. 10,432,486 on Sep. 24, 2019, which is a Continuation of U.S. application Ser. No. 15/959,978, filed Apr. 23, 2018, which issued as U.S. Pat. No. 10,152,374 on Dec. 11, 2018, which is a Continuation of U.S. application Ser. No. 14/989,264, filed Jan. 6, 2016, which issued as U.S. Pat. No. 9,952,925 on Apr. 24, 2018, the contents of which are included herein by reference.

TECHNICAL FIELD

The present disclosure relates generally to semiconductor memory apparatuses and methods, and more particularly, to apparatuses and methods related to calculating error codes on sensing circuitry.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the operations and/or data may also be sequenced and/or buffered.

In many instances, the processing resources (e.g., processor and/or associated functional unit circuitry) may be external to the memory array, and data can be accessed (e.g., via a bus between the processing resources and the memory array) to execute instructions. Data can be moved from the memory array to registers external to the memory array via a bus.

The processing resources may be used for security purposes. That is, the processing resource may be used to determine whether a device is has been the target of a security breach.

BRIEF DESCRIPTION OF THE DRAWINGS

FIG. 4 is a logic table illustrating selectable logic operation results implemented by a sensing circuitry shown in FIG. 3 in accordance with a number of embodiments of the present disclosure.

DETAILED DESCRIPTION

Figure 1A:
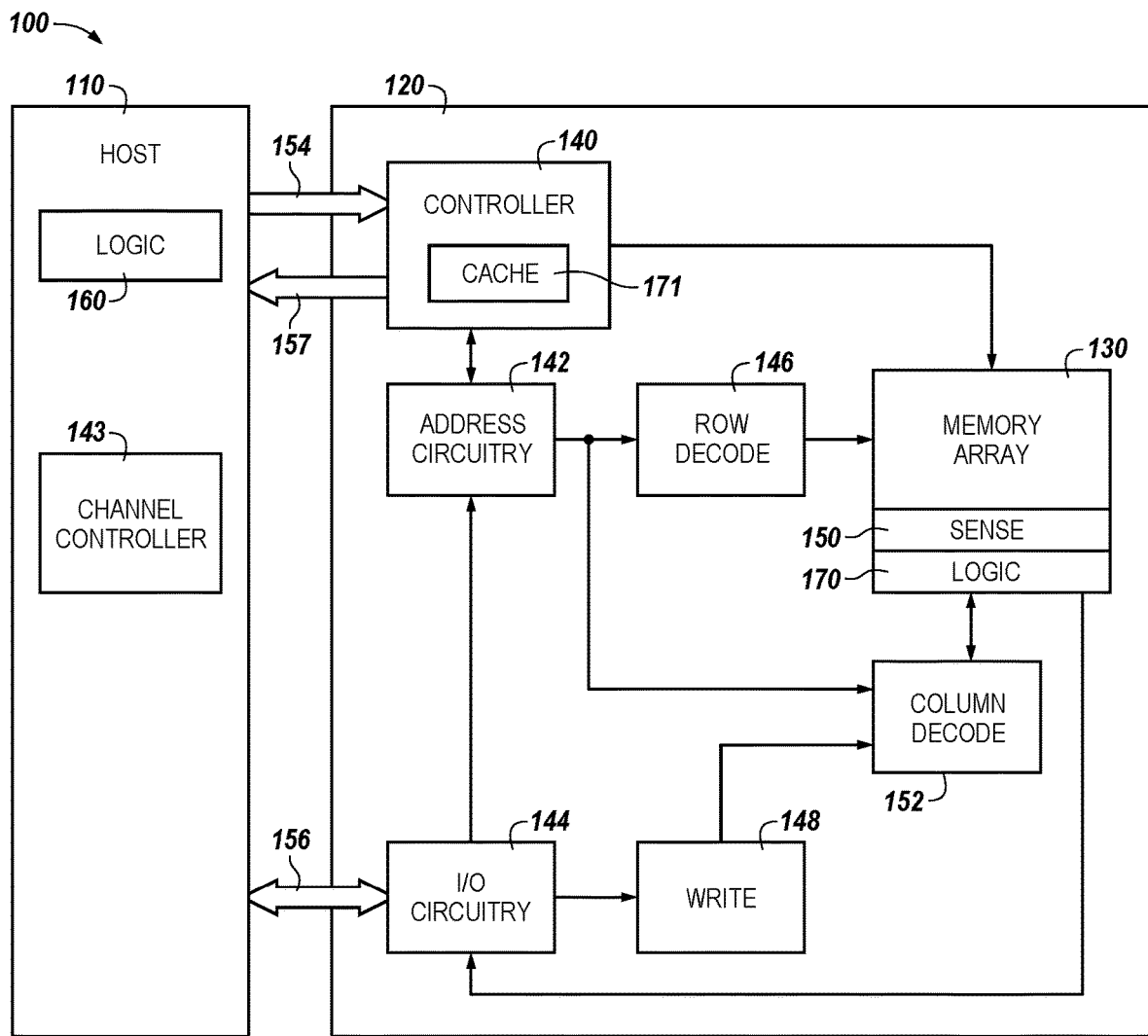
FIG. 1A is a block diagram of an apparatus in the form of a computing system including a memory device in accordance with a number of embodiments of the present disclosure.

The present disclosure includes apparatuses and methods related to calculating error codes on sensing circuitry. In a number of embodiments, an apparatus comprises an array of memory cells that are coupled to sense lines and that store data. The apparatus also comprises sensing circuitry coupled to the sense lines and configured to execute instructions to calculate an error code for the data and compare the error code with an initial error code for the data to determine whether the data has been modified.

As used herein, an error code is a code that is used to determine whether data stored in the array has been modified in a given time period. Determining whether data stored in an array has been modified can include comparing two different error codes that correspond to what should be the same data stored in the array. For example, a first error code can be calculated at a first time and a second error code can be calculated at a second time. Comparing the first error code with the second error code can include determining whether the data has been modified during the time period beginning at the first time and ending at the second time. The error code can be calculated from the data as will be described below.

The first error code and/or the second error code can be calculated via a plurality of processing resources that are incorporated into the sensing circuitry of a memory array. For example, some memory arrays can be coupled to sensing circuitry comprising a plurality of sensing components each corresponding to one of a respective plurality of sense lines of the array and serving as one of a respective plurality of processing resources (e.g., a plurality of 1-bit processors). In various instances, the plurality of 1-bit processors can operate in parallel on data stored in a memory array. The data can be stored such that each of the data units (e.g., bits) of a particular data element (e.g., word) are stored at successive addresses in the memory space corresponding to a particular processing resource. In this manner, in an array comprising 16K columns, 16K vertically stored data elements could be processed in parallel by the corresponding 16K 1-bit processors.

Embodiments of the present disclosure can provide benefits such as creating an error code and determining whether data has changed in a more efficient manner and/or using less circuitry as compared to previous approaches, among other benefits. In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N," "X," "Y," etc., particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1A, and a similar element may be referenced as 110 in FIG. 1B. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense FIG. 1A is a block diagram of an apparatus in the form of a computing system 100 including a memory device 120 in accordance with a number of embodiments of the present disclosure. As used herein, a memory device 120, memory controller 140, memory array 130, sensing circuitry 150, and logic circuitry 170 might also be separately considered an "apparatus."

Figure 1B:
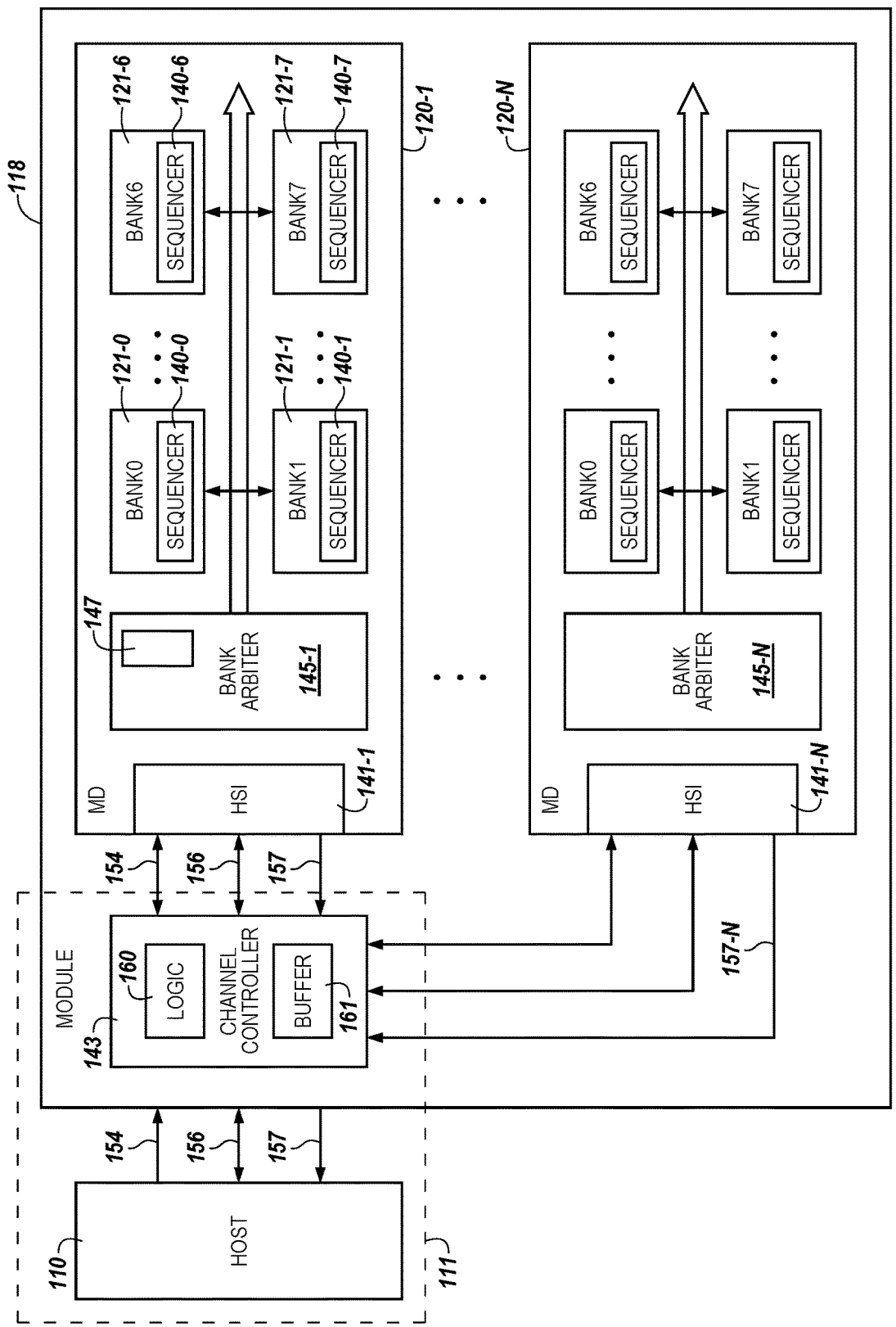
FIG. 1B is a block diagram of an apparatus in the form of a computing system including a memory device in accordance with a number of embodiments of the present disclosure.

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIGS. 1A and 1B illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines. Although a single array 130 is shown in FIG. 1, embodiments are not so limited. For instance, memory device 120 may include a number of arrays 130 (e.g., a number of banks of DRAM cells, NAND flash cells, etc.).

The memory device 120 includes address circuitry 142 to latch address signals provided over a bus 156 (e.g., an I/O bus) through I/O circuitry 144. Status and/or exception information can be provided from the controller 140 on the memory device 120 to a channel controller, through a high speed interface (HSI) including an out-of-band (OOB) bus, which in turn can be provided from the channel controller to the host 110. Controller 140 can include a cache 171 for storing data. The cache 171 can include a number of memory cells (e.g., SRAM Cell Array) and decode circuitry (e.g., muxes, gates, and row decoders). Address signals are received through address circuitry 142 and decoded by a row decoder 146 and a column decoder 152 to access the memory array 130. The address signals can also be provided to controller 140. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130.

Controller 140, e.g., bank control logic and/or sequencer, decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110 and sequencing access to the array 130. The memory controller 140 can be a state machine, a sequencer, or some other type of controller. The controller 140 can control shifting data (e.g., right or left) in an array (e.g., memory array 130), as well as a number of instructions that are provided to the sensing circuitry 150 and the logic 170 that enable the sensing circuitry 150 and the logic 170 to calculate error codes by performing logical operations.

Examples of the sensing circuitry 150 can comprise a number of sense amplifiers and a number of corresponding compute components, which may serve as, and be referred to herein as, accumulators and can be used to perform logical operations (e.g., on data associated with complementary data lines).

In a number of embodiments, the sensing circuitry 150 can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array. Additional logic circuitry 170 can be coupled to the sensing circuitry 150 and can be used to store, e.g., cache and/or buffer, results of operations described herein.

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 150) can be used to perform logical operations without enabling column decode lines of the array; however, the local I/O line(s) may be enabled in order to transfer a result to a suitable location other than back to the array 130 (e.g., to an external register).

In a number of examples, the memory array 130 can store data that can be monitored to determine whether the data has been modified. Data stored in the memory array 130 can include sensitive data. As used herein, sensitive data describes data that is placed into memory and is fixed (e.g., is not swapped out). Fixed data includes data that is not modified for a given time period. Sensitive data can include passwords, documents, and files, among other types of sensitive data. Sensitive data can also include code storage. As used herein, code storage includes static machine executable instructions that can be executed by either a host 110 and/or by the sensing circuitry 150, among other processing resources. Static machine executable instructions references machine executable instructions that do not change. Code storage can include, for example, an operating system or portions of the operating system (OS). Code storage can also include. For example, sensitive data can include network services, a task scheduler, memory management unit, and/or a core, among other portions of the OS.

The host 110 can store instructions in the memory array 130 to provide the ability to determine whether data in the memory array 130 has been modified. The host 110 can also initiate the execution of the stored instructions by instructing the controller 140 to initiate the execution of the stored instructions in the sensing circuitry 150. The host 110 can provide an address range that corresponds to memory cells in the array. The stored instructions can be executed to monitor the memory cells identified by the provided address range to determine whether data in the memory array 140 has been modified. The host 110 can provide the address range to controller 140.

For example, the host 110 can store an OS in memory as part of a boot sequence. The host 110 can provide the address range where the boot sequence and/or the OS system are stored in memory to the controller 140. The host 110 can also store data in memory and provide an address range where the data is stored in the memory to the controller 140.

The host 110 can also indicate to the controller 140 a number of responses that the controller 140 and/or the sensing circuitry 150 can implement in response to a determination that the monitored data has been modified. In a number of examples, the host 110 can implement a response to a determination that the monitored data has been modified. For example, the host 110 can halt the system 100. Halting the system 100 can include ceasing the execution of instructions on the host 110, the controller 140, and/or the sensing circuitry 150.

The controller 140 can receive the memory address range and can retrieve instructions (PIM instructions) from memory array 130 to determine whether data stored in memory cells corresponding to the memory address range has been modified. The controller 140 can provide the PIM instructions to the sensing circuitry 150 to determine whether the stored data has been modified.

The controller 140 can provide the PIM instructions once to the sensing circuitry 150 and/or continuously. For example, the controller 140 can provide the PIM instructions to the sensing circuitry 150 repeatedly at particular intervals of time. For example, a time interval can be a second, among other time intervals, such that the controller 140 can provide the PIM instructions to the sensing circuitry 150 every second.

If it is determined that the sensitive data has been modified, then the controller 140 respond to the determination. For example, the controller 140 can notify the host 110, halt further execution of PIM instructions, launch the execution of a different number of PIM instructions, and/or continue to monitor the sensitive data. The controller 140 can communicate with host 110 via a data collection system. The data collections system can include a high speed interface such as control bus 154, OOB 157, and/or data bus 156. The data collection system can also include memory cells that have an address that does not fall within the memory address range that is monitored. For example, the controller 140 can store a notice that the sensitive data has been modified in memory cells of memory array 130. The host 110 can monitor the memory cells of memory array 130 to determine whether the data has been modified.

The sensing circuitry 150 can receive and execute the instructions provided by the controller 140. The sensing circuitry 150 can calculate an error code to determine whether sensitive data has been modified. An error code can include be a check value created via cyclic redundancy check (CRC) and/or a message digest created via a hash function, among other error codes. The error code can represent the sensitive data such that a change to the sensitive data can result in a change to the error code.

The error code can be created from the sensitive data. That is, the sensitive data can be manipulated to create the error code. In a number of examples, a different error code can be created for different portions of the sensitive data. For example, a first error code can be created for a first portion of the sensitive data and a second error code can be created for a second portion of the sensitive data. The portion of the sensitive data can correlate with the structure of the memory array 130. For example, a portion of the sensitive data can include data stored in memory cells coupled to an access line. Such that, for example, data stored in memory cells coupled to a first access line can be used to create a first error code and data stored in memory cells coupled to a second access line can be used to create a second error code. In a number of examples, a plurality of error codes that are created from sensitive data at a particular time can be combined to create one error code for the sensitive data. For example, the first error code that represents a first portion of the sensitive data and a second error code that represents a second portion of the sensitive data can be can be combined to create an error code that represents the sensitive data.

The error code can be created at a number of different intervals. For example, a first error code of the sensitive data can be created in response to the storing of the sensitive data in the memory array 130 at a first time (e.g., t1). A second error code of the sensitive data can be created in response to a request from the host 110 at a second time (e.g., t2). The created error codes can be stored in the memory array 130 and/or the cache 171, among other possible storage location for the created error codes. The created error codes can be retrieved from the memory array 130 to compare the error codes to recently created error codes. For example, the first error code can be created and stored in the memory array 130. The second error code can be created and stored in the sensing circuitry 150 (e.g., the compute component 231 in FIG. 2). The first error code can be retrieved from the memory array 130 and stored in the sensing circuitry 150 (e.g., the sense amplifier 206 in FIG. 2). The first error code and the second error code can be compared on the sensing circuitry 150.

The error codes can be compared to determine whether the first error code and the second error code are a same error code. That is, the error codes can be compared to determine whether the error codes have changed in the time interval in which the first error code was created and the second error code was created. A change in the error codes can indicate that the sensitive data has been modified. A change to the sensitive data can be an unwanted change created by, for example, malware. A change to the error code can also indicate a malfunction of the system. The system can malfunction in response to, for example, bugs in the system.

The sensing circuitry 150 can calculate an error code and/or compare the error codes by executing a number of AND operations, OR operations, SHIFT operation, and/or INVERT operation, among other logical operations, without transferring data via an input/output (I/O) line. Implementing AND operations, OR operations, SHIFT operations, and/or INVERT operations using the sensing circuitry 150 is described in FIGS. 3 and 4.

The logical operations executed to calculate an error code and/or compare the error codes can be executed on the sensing circuitry 150 without being interrupted. That is, a first number of logical operations can be executed to calculate an error code and/or compare error codes without stopping the execution of first number of logical operations to execute a second number of logical operations to perform different actions not related to the calculation of the error code and/or the comparison of error codes.

The execution of a first number of logical operations to calculate an error code and/or compare error codes can be distributed between an execution of a second number of logical operations. For example, a first group of logical operations from the first number of logical operations can be executed before a first group of logical operations from the second number of logical operations is executed. A second group of logical operations from the first number of logical operation can be executed after the first group of logical operation from the second number of logical operations is executed.

In a number of examples, determining whether data has been modified can include calculating error codes and/or comparing error codes as part of logical operations that perform a different action. For example, error codes can be calculated and/or error codes can be compared as part of a refresh of the array 130.

Performing a refresh of the data stored in memory array 130 can include storing the data in sensing circuitry 150. The memory controller can determine whether memory cells that are refreshed fall within the memory address range provided by the host 110. If the memory cells do not fall within the memory address range, then other memory cells can continue to be refreshed. If memory cells are within the memory address range, then an error code can be created and the error codes can be compared for the data stored in the memory cells that are within the memory address range.

A refresh can include storing data in the sensing circuitry 150. Once the data is stored in the sensing circuitry 150, then an error code can be created for the stored data. The error code can be compared to a previously created error code for the data to determine whether the data has been modified.

Determining whether the data has been modified as part of the refresh can reduce the time needed to refresh the data and determine whether the data has been modified separately because both actions (e.g., refresh, and determine whether the data has been modified) include storing data in the sensing circuitry 150. Storing the data in the sensing circuitry 150 once to refresh the data and to determine whether the data has been modified reduces the number of times the data is stored in the sensing circuitry 150 which in turn reduces the time it takes to refresh the data and to determine whether the data has been modified.

FIG. 1B is a block diagram of an apparatus architecture in the form of a computing system including a plurality of memory devices 120-1, . . . , 120-N coupled to a host 110 via a channel controller 143 in accordance with a number of embodiments of the present disclosure. In at least one embodiment the channel controller 143 may be coupled to the plurality of memory devices 120-1, . . . , 120-N in an integrated manner in the form of a module 118, e.g., formed on same chip with the plurality of memory devices 120-1, . . . , 120-N. In an alternative embodiment, the channel controller 143 may be integrated with the host 110, as illustrated by dashed lines 111, e.g., formed on a separate chip from the plurality of memory devices 120-1, . . . , 120-N. The channel controller 143 can be coupled to each of the plurality of memory devices 120-1, . . . , 120-N via a control bus (e.g., address and control (A/C) bus) 154 as described in FIG. 1A which in turn can be coupled to the host 110. The channel controller 143 can also be coupled to each of the plurality of memory devices, 120-1, . . . , 120-N via a data bus 156 as described in FIG. 1A which in turn can be coupled to the host 110. In addition, the channel controller 143 can be coupled to each of the plurality of memory devices 120-1, . . . , 120-N via an OOB bus 157 associated with a high speed interface (HSI) 141, described more in connection with FIGS. 5-8, that is configured to report status, exception and other data information to the channel controller 143 to exchange with the host 110. For example, the channel controller 143 can notify the host 110 that a first error code and a second error code are not the same indicating that data stored in a particular number of memory cells has been modified. The channel controller 143 can notify the host 110 via control bus 154, data bus 156, and/or OOB bus 157.

As shown in FIG. 1B, the channel controller 143 can receive the status and exception information from a high speed interface (HSI) (also referred to herein as a status channel interface) 141 associated with a bank arbiter 145 in each of the plurality of memory devices 120-1, . . . , 120-N. In the example of FIG. 1B, each of the plurality of memory devices 120-1, . . . , 120-N can include a bank arbiter 145 to sequence control and data with a plurality of banks, e.g., Bank zero (0), Bank one (1), . . . , Bank six (6), Bank seven (7), etc. Each of the plurality of banks, Bank 0, . . . , Bank 7, can include a memory controller 140 and other components, including an array of memory cells 130 and sensing circuitry 150, peripheral logic 170, etc., as described in connection with FIG. 1A.

That is, each of the plurality of banks, e.g., Bank 0, . . . , Bank 7, in the plurality of memory devices 120-1, . . . , 120-N can include address circuitry 142 in FIG. 1A to latch address signals provided over a data bus 156 (e.g., an I/O bus) through I/O circuitry 144. Status, exception information, and/or a notification that that data stored in a particular number of memory cells has changed can be provided from the memory controller 140 on the memory device 120 to the channel controller 143, using the OOB bus 157, which in turn can be provided from the plurality of memory devices 120-1, . . . , 120-N to the host 110. For each of the plurality of banks, e.g., Bank 0, . . . , Bank 7, address signals can be received through address circuitry 142 in FIG. 1A and decoded by a row decoder 146 and a column decoder 152 in FIG. 1A to access the memory array 130 in FIG. 1A. Data can be read from memory array 130 by sensing voltage and/or current changes on the data lines using sensing circuitry 150 in FIG. 1A. The sensing circuitry 150 can read and latch a page (e.g., row) of data from the memory array 130. The I/O circuitry 144 in FIG. 1A can be used for bi-directional data communication with host 110 over the data bus 156. The write circuitry 148 in FIG. 1A can used to write data to the memory array 130 and the OOB bus 157 can be used to report status, exception and other data information to the channel controller 143.

The channel controller 143 can include one or more local buffers 161 to store an program instructions and can include logic 160 to allocate a plurality of locations, e.g., subarrays, in the arrays of each respective bank to store bank commands, and arguments, (PIM commands) for the various banks associated with to operation of each of the plurality of memory devices 120-1, . . . , 120-N. The channel controller 143 can dispatch commands, e.g., PIM commands, to the plurality of memory devices 120-1, . . . , 120-N to store those program instructions within a given bank of a memory device.

As described above in connection with FIG. 1A, the memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines.

As in FIG. 1A, a memory controller 140, e.g., bank control logic and/or sequencer, associated with any particular bank, Bank 0, . . . , Bank 7, in a given memory device, 120-1, . . . , 120-N, can decode signals provided by control bus 154 from the host 110. These signals can include chip enable signals, write enable signals, and address latch signals that are used to control operations performed on the memory array 130, including data read, data write, and data erase operations. In various embodiments, the memory controller 140 is responsible for executing instructions from the host 110. And, as above, the memory controller 140 can be a state machine, a sequencer, or some other type of controller. That is, the controller 140 can control shifting data (e.g., right or left) in an array, e.g., memory array 130.

Figure 2:
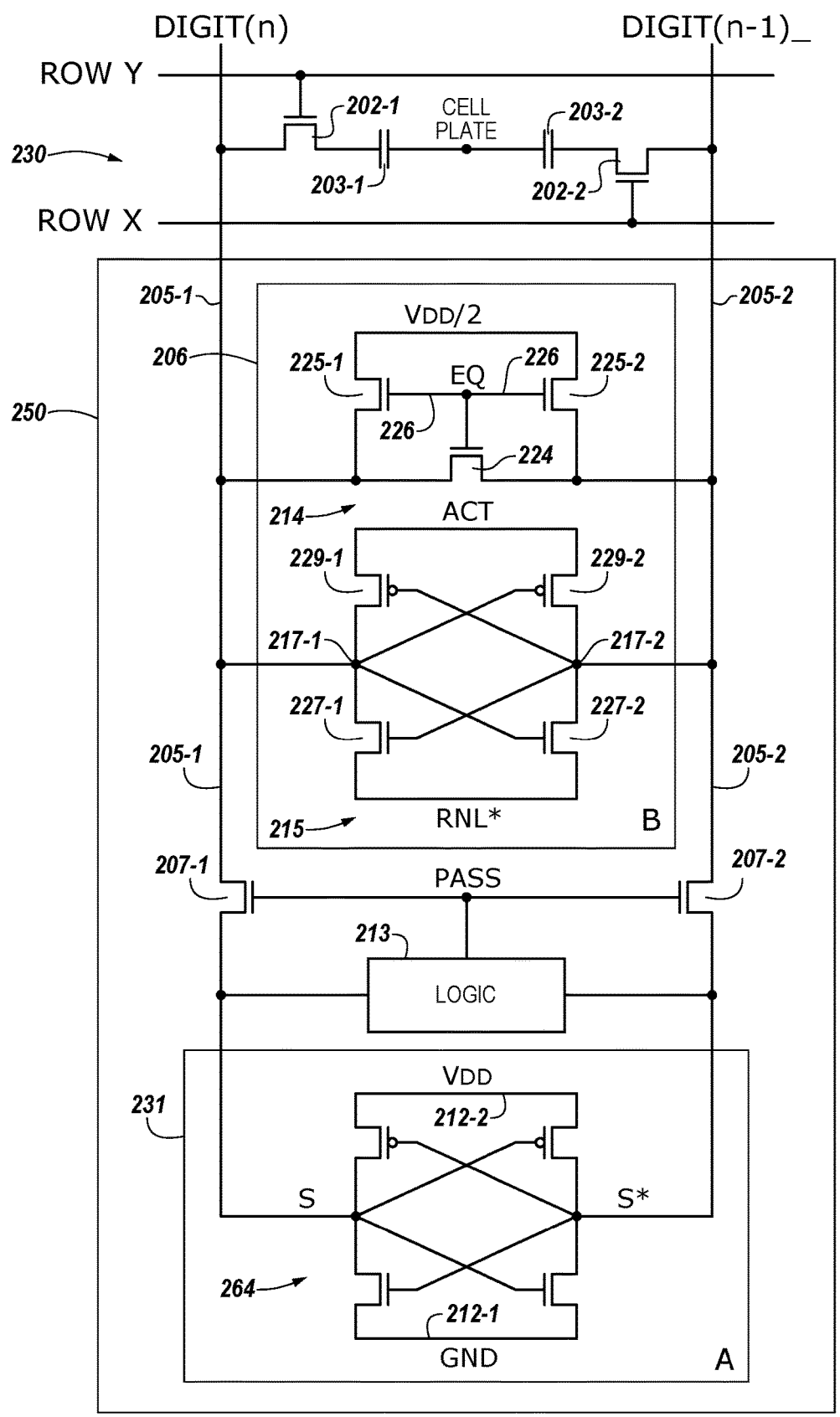
FIG. 2 is a block diagram of a bank of a memory device in accordance with a number of embodiments of the present disclosure.

FIG. 2 is a schematic diagram illustrating sensing circuitry 250 in accordance with a number of embodiments of the present disclosure. The sensing circuitry 250 can correspond to sensing circuitry 150 shown in FIG. 1A. The sense amplifier 206 of sensing circuitry 250 can correspond to sense amplifiers 206 shown in FIG. 2, and the compute component 231 of sensing circuitry 250 can correspond to sensing circuitry, including compute component.

A memory cell comprises a storage element (e.g., capacitor) and an access device (e.g., transistor). For instance, a first memory cell comprises transistor 202-1 and capacitor 203-1, and a second memory cell comprises transistor 202-2 and capacitor 203-2, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read).

The cells of the memory array 230 can be arranged in rows coupled by word lines 204-X (Row X), 204-Y (Row Y), etc., and columns coupled by pairs of complementary sense lines (e.g., data lines DIGIT(n−1)/DIGIT(n−1)_, DIGIT(n)/DIGIT(n)_, DIGIT(n+1)/DIGIT(n+1)_). The individual sense lines corresponding to each pair of complementary sense lines can also be referred to as data lines 205-1 (D) and 205-2 (D_) respectively. Although only one pair of complementary data lines are shown in FIG. 2, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-1 can be coupled to data line 205-1 (D), a second source/drain region of transistor 202-1 can be coupled to capacitor 203-1, and a gate of a transistor 202-1 can be coupled to word line 204-X. A first source/drain region of a transistor 202-2 can be coupled to data line 205-2 (D_), a second source/drain region of transistor 202-2 can be coupled to capacitor 203-2, and a gate of a transistor 202-2 can be coupled to word line 204-Y. The cell plate, as shown in FIG. 2, can be coupled to each of capacitors 203-1 and 203-2. The cell plate can be a common node to which a reference voltage (e.g., ground) can be applied in various memory array configurations.

The memory array 230 is coupled to sensing circuitry 250 in accordance with a number of embodiments of the present disclosure. In this example, the sensing circuitry 250 comprises a sense amplifier 206 and a compute component 231 corresponding to respective columns of memory cells (e.g., coupled to respective pairs of complementary data lines). The sense amplifier 206 can be coupled to the pair of complementary sense lines 205-1 and 205-2. The compute component 231 can be coupled to the sense amplifier 206 via pass gates 207-1 and 207-2. The gates of the pass gates 207-1 and 207-2 can be coupled to logical operation selection logic 213.

The logical operation selection logic 213 can be configured to include pass gate logic for controlling pass gates that couple the pair of complementary sense lines un-transposed between the sense amplifier 206 and the compute component 231 (as shown in FIG. 2) and/or swap gate logic for controlling swap gates that couple the pair of complementary sense lines transposed between the sense amplifier 206 and the compute component 231. The logical operation selection logic 213 can also be coupled to the pair of complementary sense lines 205-1 and 205-2. The logical operation selection logic 213 can be configured to control continuity of pass gates 207-1 and 207-2 based on a selected logical operation, as described in detail below for various configurations of the logical operation selection logic 413.

The sense amplifier 206 can be operated to determine a data value (e.g., logic state) stored in a selected memory cell. The sense amplifier 206 can comprise a cross coupled latch, which can be referred to herein as a primary latch. In the example illustrated in FIG. 2, the circuitry corresponding to sense amplifier 206 comprises a latch 215 including four transistors coupled to a pair of complementary data lines D 205-1 and D_205-2. However, embodiments are not limited to this example. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). The cross coupled latch 215 comprising transistors 227-1, 227-2, 229-1, and 229-2 can be referred to as a primary latch.

In operation, when a memory cell is being sensed (e.g., read), the voltage on one of the data lines 205-1 (D) or 205-2 (D_) will be slightly greater than the voltage on the other one of data lines 205-1 (D) or 205-2 (D_). An ACT signal and the RNL* signal can be driven low to enable (e.g., fire) the sense amplifier 206. The data lines 205-1 (D) or 205-2 (D_) having the lower voltage will turn on one of the PMOS transistor 229-1 or 229-2 to a greater extent than the other of PMOS transistor 229-1 or 229-2, thereby driving high the data line 205-1 (D) or 205-2 (D_) having the higher voltage to a greater extent than the other data line 205-1 (D) or 205-2 (D_) is driven high.

Similarly, the data line 205-1 (D) or 205-2 (D_) having the higher voltage will turn on one of the NMOS transistor 227-1 or 227-2 to a greater extent than the other of the NMOS transistor 227-1 or 227-2, thereby driving low the data line 205-1 (D) or 205-2 (D_) having the lower voltage to a greater extent than the other data line 205-1 (D) or 205-2 (D_) is driven low. As a result, after a short delay, the data line 205-1 (D) or 205-2 (D_) having the slightly greater voltage is driven to the voltage of the supply voltage $V_{CC}$ through source transistor 211, and the other data line 205-1 (D) or 205-2 (D_) is driven to the voltage of the reference voltage (e.g., ground) through the sink transistor 213. Therefore, the cross coupled NMOS transistors 227-1 and 227-2 and PMOS transistors 229-1 and 229-2 serve as a sense amplifier pair, which amplify the differential voltage on the data lines 205-1 (D) and 205-2 (D_) and operate to latch a data value sensed from the selected memory cell. As used herein, the cross coupled latch of sense amplifier 206 may be referred to as a primary latch 215.

Embodiments are not limited to the sense amplifier 206 configuration illustrated in FIG. 2. As an example, the sense amplifier 206 can be current-mode sense amplifier and/or single-ended sense amplifier (e.g., sense amplifier coupled to one data line). Also, embodiments of the present disclosure are not limited to a folded data line architecture such as that shown in FIG. 2.

The sense amplifier 206 can, in conjunction with the compute component 231, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches. For example, the sense amplifier 206 can, in conjunction with the compute component 231, be operated to calculate an error code for data stored in an array and to compare the error code with an initial error code for the data to determine whether the data has been modified.

The sense amplifier 206 can further include equilibration circuitry 214, which can be configured to equilibrate the data lines 205-1 (D) and 205-2 (D_). In this example, the equilibration circuitry 214 comprises a transistor 224 coupled between data lines 205-1 (D) and 205-2 (D_). The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of transistor 225-1 can be coupled data line 205-1 (D) and a second source/drain region of transistor 225-2 can be coupled data line 205-2 (D_). Gates of transistors 224, 225-1 and 225-2 can be coupled together, and to an equilibration (EQ) control signal line 226. As such, activating EQ enables the transistors 224, 225-1, and 225-2, which effectively shorts data lines 205-1 (D) and 205-2 (D_) together and to the an equilibration voltage (e.g., $V_{CC}/2$).

Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As described further below, in a number of embodiments, the sensing circuitry (e.g., sense amplifier 206 and compute component 231) can be operated to perform a selected logical operation and initially store the result in one of the sense amplifier 206 or the compute component 231 without transferring data from the sensing circuitry via an I/O line (e.g., without performing a data line address access via activation of a column decode signal, for instance).

Performance of logical operations (e.g., Boolean logical functions involving data values) is fundamental and commonly used. Boolean logic functions are used in many higher level functions. Consequently, speed and/or power efficiencies that can be realized with improved logical operations, can translate into speed and/or power efficiencies of higher order functionalities.

As shown in FIG. 2, the compute component 231 can also comprise a latch, which can be referred to herein as a secondary latch 264. The secondary latch 264 can be configured and operated in a manner similar to that described above with respect to the primary latch 215, with the exception that the pair of cross coupled p-channel transistors (e.g., PMOS transistors) comprising the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component is not limited to that shown in FIG. 2 at 231, and various other embodiments are described further below.

Figure 3:
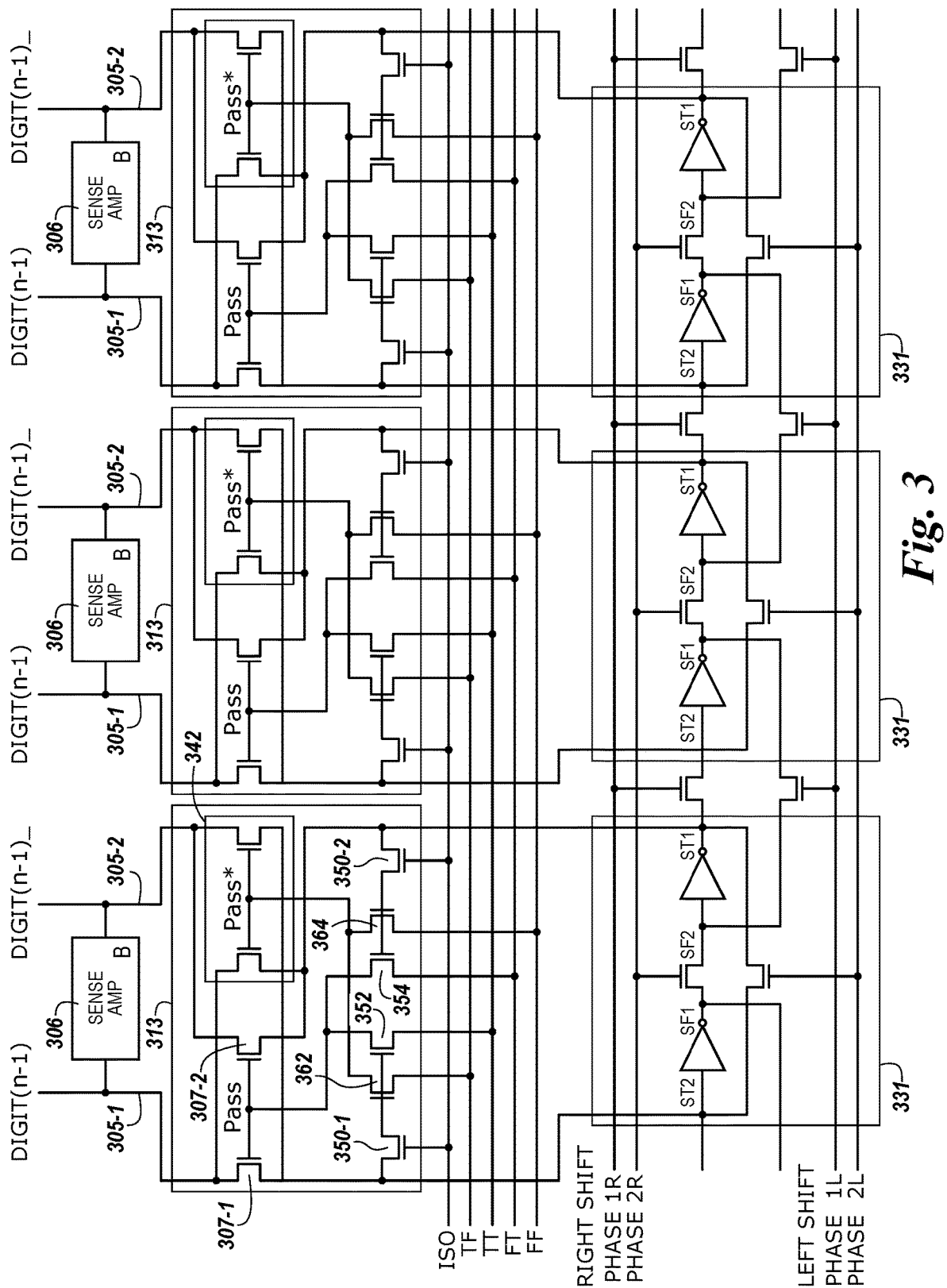
FIG. 3 is a schematic diagram illustrating sensing circuitry to a memory device in accordance with a number of embodiments of the present disclosure.

FIG. 3 is a schematic diagram illustrating sensing circuitry capable of implementing an XOR logical operation in accordance with a number of embodiments of the present disclosure. FIG. 3 shows a sense amplifier 306 coupled to a pair of complementary sense lines 305-1 and 305-2, and a compute component 331 coupled to the sense amplifier 306 via pass gates 307-1 and 307-2. The sense amplifier 306 shown in FIG. 3 can correspond to sense amplifier 206 shown in FIG. 2. The compute component 331 shown in FIG. 3 can correspond to sensing circuitry, including compute component, 150 shown in FIG. 1A, for example. The logical operation selection logic 313 shown in FIG. 3 can correspond to logical operation selection logic 413 shown in FIG. 4, for example.

The gates of the pass gates 307-1 and 307-2 can be controlled by a logical operation selection logic signal, Pass. For example, an output of the logical operation selection logic can be coupled to the gates of the pass gates 307-1 and 307-2. The compute component 331 can comprise a loadable shift register configured to shift data values left and right.

The sensing circuitry shown in FIG. 3 also shows a logical operation selection logic 313 coupled to a number of logic selection control input control lines, including ISO, TF, TT, FT, and FF. Selection of a logical operation from a plurality of logical operations is determined from the condition of logic selection control signals on the logic selection control input control lines, as well as the data values present on the pair of complementary sense lines 305-1 and 305-2 when the isolation transistors are enabled via the ISO control signal being asserted.

According to various embodiments, the logical operation selection logic 313 can include four logic selection transistors: logic selection transistor 362 coupled between the gates of the swap transistors 342 and a TF signal control line, logic selection transistor 352 coupled between the gates of the pass gates 307-1 and 307-2 and a TT signal control line, logic selection transistor 354 coupled between the gates of the pass gates 307-1 and 307-2 and a FT signal control line, and logic selection transistor 364 coupled between the gates of the swap transistors 342 and a FF signal control line. Gates of logic selection transistors 362 and 352 are coupled to the true sense line through isolation transistor 350-1 (having a gate coupled to an ISO signal control line). Gates of logic selection transistors 364 and 354 are coupled to the complementary sense line through isolation transistor 350-2 (also having a gate coupled to an ISO signal control line).

Data values present on the pair of complementary sense lines 305-1 and 305-2 can be loaded into the compute component 331 via the pass gates 307-1 and 307-2. The compute component 331 can comprise a loadable shift register. When the pass gates 307-1 and 307-2 are OPEN, data values on the pair of complementary sense lines 305-1 and 305-2 are passed to the compute component 331 and thereby loaded into the loadable shift register. The data values on the pair of complementary sense lines 305-1 and 305-2 can be the data value stored in the sense amplifier 306 when the sense amplifier is fired. The logical operation selection logic signal, Pass, is high to OPEN the pass gates 307-1 and 307-2.

The ISO, TF, TT, FT, and FF control signals can operate to select a logical function to implement based on the data value ("B") in the sense amplifier 306 and the data value ("A") in the compute component 331. In particular, the ISO, TF, TT, FT, and FF control signals are configured to select the logical function to implement independent from the data value present on the pair of complementary sense lines 305-1 and 305-2 (although the result of the implemented logical operation can be dependent on the data value present on the pair of complementary sense lines 305-1 and 305-2. That is, the ISO, TF, TT, FT, and FF control signals select the logical operation to implement directly since the data value present on the pair of complementary sense lines 305-1 and 305-2 is not passed through logic to operate the gates of the pass gates 307-1 and 307-2.

Additionally, FIG. 3 shows swap transistors 342 configured to swap the orientation of the pair of complementary sense lines 305-1 and 305-2 between the sense amplifier 313-7 and the compute component 331. When the swap transistors 342 are OPEN, data values on the pair of complementary sense lines 305-1 and 305-2 on the sense amplifier 306 side of the swap transistors 342 are oppositely-coupled to the pair of complementary sense lines 305-1 and 305-2 on the compute component 331 side of the swap transistors 342, and thereby loaded into the loadable shift register of the compute component 331.

The logical operation selection logic signal Pass can be activated (e.g., high) to OPEN the pass gates 307-1 and 307-2 (e.g., conducting) when the ISO control signal line is activated and either the TT control signal is activated (e.g., high) with data value on the true sense line is "1" or the FT control signal is activated (e.g., high) with the data value on the complement sense line is "1."

The data value on the true sense line being a "1" OPENs logic selection transistors 352 and 362. The data value on the complimentary sense line being a "1" OPENs logic selection transistors 354 and 364. If the ISO control signal or either the respective TT/FT control signal or the data value on the corresponding sense line (e.g., sense line to which the gate of the particular logic selection transistor is coupled) is not high, then the pass gates 307-1 and 307-2 will not be OPENed by a particular logic selection transistor.

The logical operation selection logic signal PassF can be activated (e.g., high) to OPEN the swap transistors 342 (e.g., conducting) when the ISO control signal line is activated and either the TF control signal is activated (e.g., high) with data value on the true sense line is "1," or the FF control signal is activated (e.g., high) with the data value on the complement sense line is "1." If either the respective control signal or the data value on the corresponding sense line (e.g., sense line to which the gate of the particular logic selection transistor is coupled) is not high, then the swap transistors 342 will not be OPENed by a particular logic selection transistor.

The Pass* control signal is not necessarily complementary to the Pass control signal. It is possible for the Pass and Pass* control signals to both be activated or both be deactivated at the same time. However, activation of both the Pass and Pass* control signals at the same time shorts the pair of complementary sense lines together, which may be a disruptive configuration to be avoided.

The sensing circuitry illustrated in FIG. 3 is configured to select one of a plurality of logical operations to implement directly from the four logic selection control signals (e.g., logical operation selection is not dependent on the data value present on the pair of complementary sense lines). Some combinations of the logic selection control signals can cause both the pass gates 307-1 and 307-2 and swap transistors 342 to be OPEN at the same time, which shorts the pair of complementary sense lines 305-1 and 305-2 together. According to a number of embodiments of the present disclosure, the logical operations which can be implemented by the sensing circuitry illustrated in FIG. 3 can be the logical operations summarized in the logic tables shown in FIG. 4.

FIG. 4 is a logic table illustrating selectable logic operation results implemented by a sensing circuitry shown in FIG. 3 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 806 and compute component 831. The four control signals, in conjunction with a particular data value present on the complementary sense lines, controls the continuity of the pass gates 807-1 and 807-2 and swap transistors 842, which in turn affects the data value in the compute component 831 and/or sense amplifier 806 before/after firing. The capability to selectably control continuity of the swap transistors 842 facilitates implementing logical operations involving inverse data values (e.g., inverse operands and/or inverse result), among others.

Logic Table 4-1 illustrated in FIG. 4 shows the starting data value stored in the compute component 631 shown in column A at 444, and the starting data value stored in the sense amplifier 606 shown in column B at 445. The other 3 column headings in Logic Table 4-1 refer to the continuity of the pass gates 307-1 and 307-2, and the swap transistors 342, which can respectively be controlled to be OPEN or CLOSED depending on the state of the four logic selection control signals (e.g., TF, TT, FT, and FF), in conjunction with a particular data value present on the pair of complementary sense lines 305-1 and 305-2. The "Not Open" column corresponds to the pass gates 307-1 and 307-2 and the swap transistors 342 both being in a non-conducting condition, the "Open True" corresponds to the pass gates 307-1 and 307-2 being in a conducting condition, and the "Open Invert" corresponds to the swap transistors 342 being in a conducting condition. The configuration corresponding to the pass gates 307-1 and 307-2 and the swap transistors 342 both being in a conducting condition is not reflected in Logic Table 4-1 since this results in the sense lines being shorted together.

Via selective control of the continuity of the pass gates 307-1 and 307-2 and the swap transistors 342, each of the three columns of the upper portion of Logic Table 4-1 can be combined with each of the three columns of the lower portion of Logic Table 4-1 to provide 3×3=9 different result combinations, corresponding to nine different logical operations, as indicated by the various connecting paths shown at 475. The nine different selectable logical operations that can be implemented by the sensing circuitry 850 are summarized in Logic Table 4-2 illustrated in FIG. 4, including an XOR logical operation.

The columns of Logic Table 4-2 illustrated in FIG. 4 show a heading 480 that includes the state of logic selection control signals. For example, the state of a first logic selection control signal is provided in row 476, the state of a second logic selection control signal is provided in row 477, the state of a third logic selection control signal is provided in row 478, and the state of a fourth logic selection control signal is provided in row 479. The particular logical operation corresponding to the results is summarized in row 447.

Figure 5:
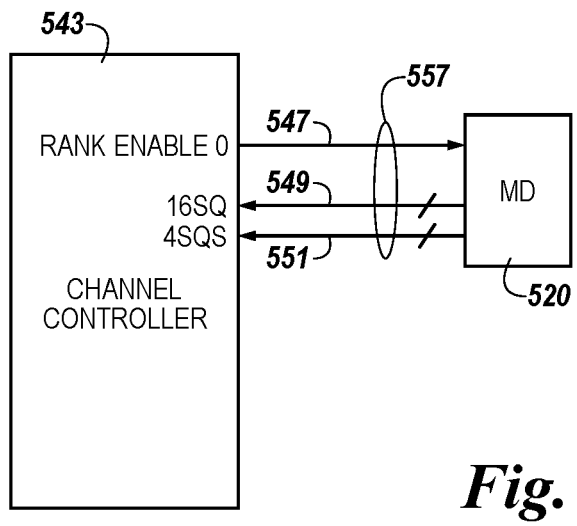
FIGS. 5-8 illustrate a number of embodiments for a high speed interface between a memory device and a host via a channel controller in accordance with the present disclosure.

FIG. 5 illustrates an example of an OOB bus (HSI) 557 between channel controller 543 and a bank arbiter of a memory device 520 in the x64DQ one (1) rank configuration. As shown in the example of FIG. 5, one rank enable bit (pin) 547 is provided from the channel controller 543 to the memory device 520. In this example, 16 SQ (status outputs/pins) 549 are received from the memory device 520 for the channel and 4 SQS (status output strobes) 551 may be received.

Figure 6:
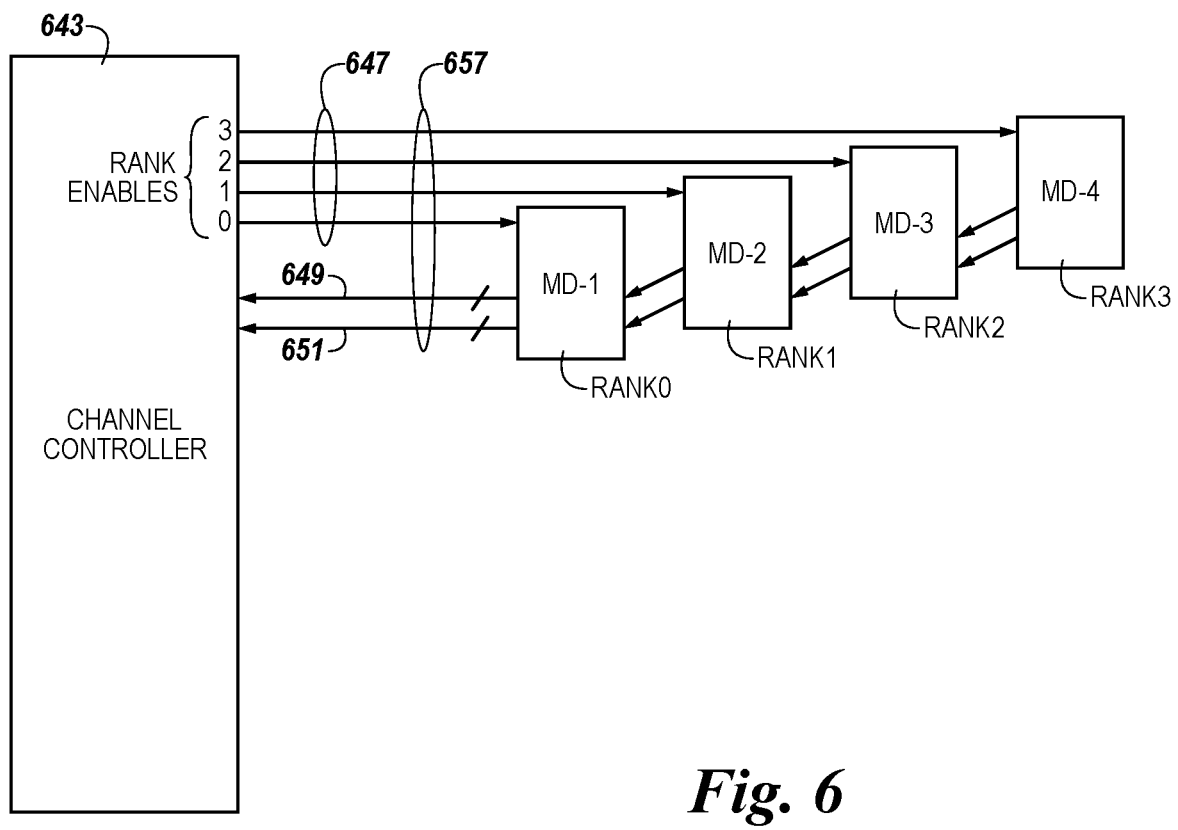

FIG. 6 illustrates an example of an OOB bus (HSI) 657 between channel controller 643 and a bank arbiter of a memory device 620 in the x64DQ four (4) rank configuration. In this example, each of four (4) separate rank enable bits 647 are shown (0, 1, 2, and 3) on the channel controller 643 independently connected for one channel to four memory devices 620-1, 620-2, . . . , 620-4. In this example, 16 SQ (status outputs) 649 are still received, but now from the four memory devices 620-1, 620-2, . . . , 620-4 for the channel. Likewise, four (4) SQS (status output strobes) 651 are received on the channel for the four memory devices 620-1, 620-2, . . . , 620-4.

In this case, the bandwidth of the status channel is divided just as the bandwidth of a double data rate (DDR) interface is divided, being effectively time domain multiplexed to avoid contention on the OOB 657. Each memory device 620, e.g., 620-1, 620-2, . . . , 620-4, is granted access to the uni-directional status bus 657 in turn as its rank enable input is activated. When x64 mode is selected (fuse option or test option), each memory device 620 may transmit one data packet at an active edge of the rank enable input. Status output bits 649 can be streamed out, 1 bit per clock cycle, synchronized to the SQS strobe pins 651. The first bit may be a preamble bit. In one example, if the preamble bit is a logic 0, the memory device, e.g., 620-1, 620-2, . . . , 620-4, will transmit a 128 bit status message on the 16 DQs on eight (8) successive clocks. At the end of this message the SQ and SQS pins will transition to a tri-state mode, and the interface circuitry will wait for the next active edge on the rank enable input to transmit additional messages. If there are no messages waiting in a memory controller's (e.g., memory controller 640 of a given memory device 620) output queue, the sense of the preamble bit will be logic 1. The SQ and SQS drivers will be turned off on the next successive clock. The memory device will go back to waiting for another active edge on the rank enable input.

Figure 7:
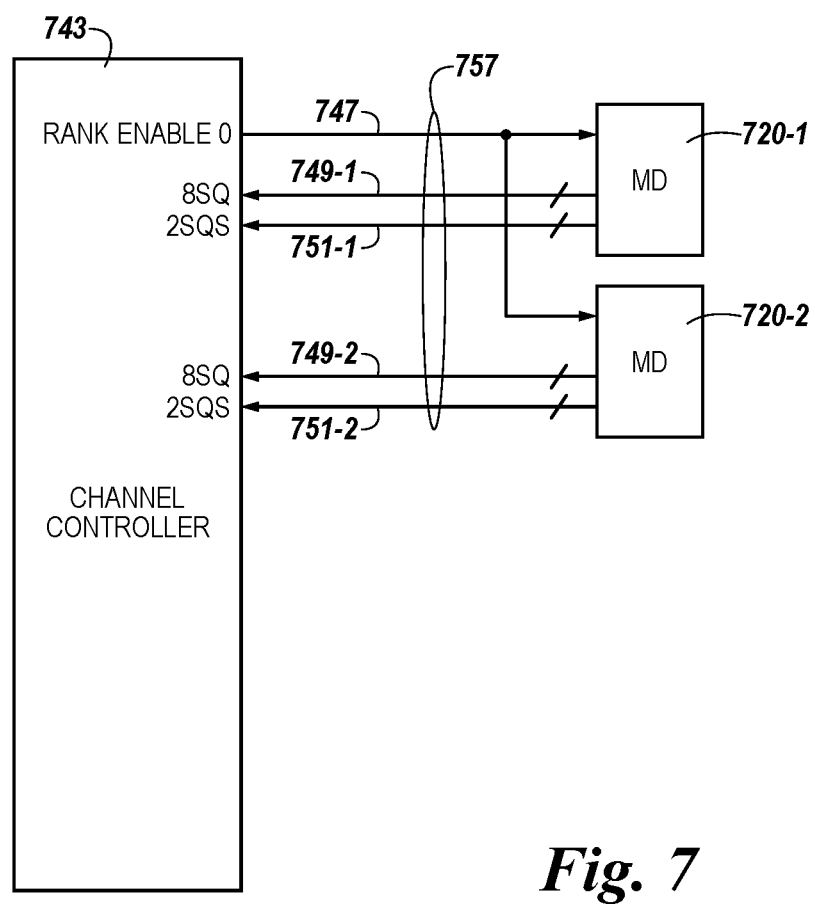

FIG. 7 illustrates an example of an OOB bus (HSI) 757 between channel controller 743 and the bank arbiter of a memory device 720 in an x32DQ one (1) rank configuration. In the case of a x32 DQ configuration on the memory 720, the status channel can be split, as shown in FIG. 7, just as the data channel can be split, with half of the status outputs 740 (as well as half of the DQs and DQSs) going to each of the memory devices 720 in the architecture.

In this example, the rank enable inputs 747 for the first rank are all tied together. Thus they will all begin transmitting their status messages on the lower eight (8) SQ pins 749. The protocol is largely the same as in the x64 case, with data being sent following a preamble on successive active clock edges of the SQSs. One deviation from the prior example is that since the data bus is half as wide for each memory device 720, the message length will increase from eight (8) data clocks to sixteen (16), to accommodate the same 128 bit message size.

Figure 8:
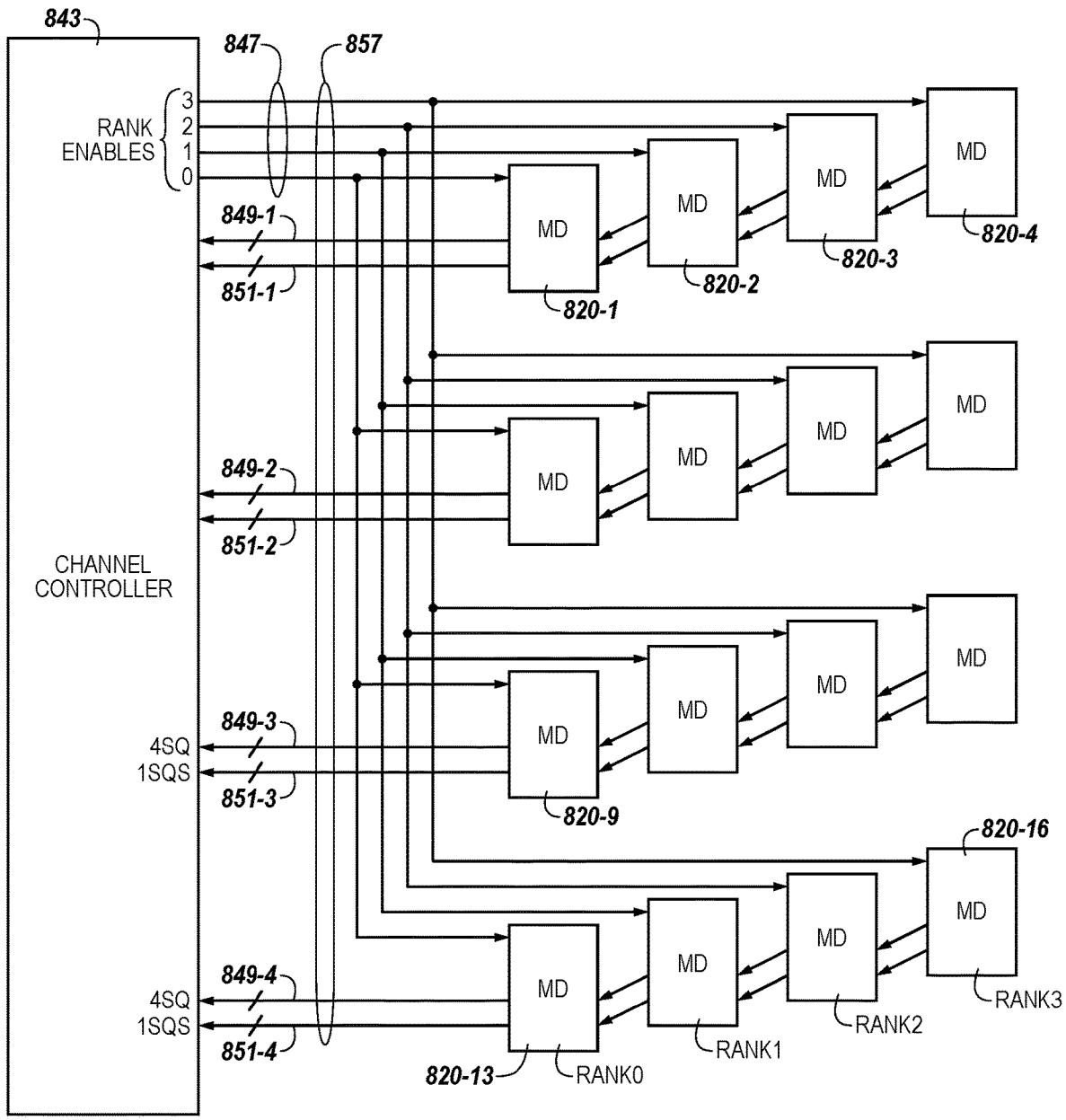

FIG. 8 illustrates an example of an OOB bus (HSI) 857 between channel controller 843 and the bank arbiter of a memory device 820 in an x16 DQ four (4) rank configuration. In the case of a x16 DQ configuration on the memory 820, the status channel can be divided, as shown in FIG. 8, into four (4) parts with each memory device, e.g., 820-1, 820-5, 820-9 and 820-13, connected to the channel controller 843 via the lowest four (4) bits of a given memory device's SQ bus 849. In the example, the number of clock cycles per message again grows, now to thirty-two (32) to accommodate the same 128 bit message size.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus comprising:
    an array of memory cells that are coupled to sense lines; and
    a controller configured to:
        control a sensing circuitry, that is coupled to the sense lines, to perform a number of operations without transferring data via an input/output (I/O) line to:
        calculate an error code for the data stored in the array of memory cells;
        compare the error code with an initial error code for the data to determine whether the data has been modified; and
        responsive to determining that the data has been modified, performing a particular action wherein performing the particular action includes an action selected from a group of actions comprising:
            halting further execution of instructions via the sensing circuitry;
            launching execution of a different number of instructions executable using the sensing circuitry; and
            continuing to monitor the data.

2. The apparatus of claim 1, wherein the controller is further configured to perform the particular action without notifying a host.

3. The apparatus of claim 1, wherein the controller is further configured to notify a host that the data has been modified responsive to determining that the error code and the initial error code are not a same error code.

4. The apparatus of claim 3, wherein the controller is further configured to notify the host utilizing a data collection system.

5. The apparatus of claim 1, wherein the data comprises user data and/or executable instructions.

6. The apparatus of claim 5, wherein the executable instructions comprise an operating system of a host.

7. The apparatus of claim 1, wherein the controller is configured to repetitively provide the instructions to the sensing circuitry at a given interval of time.

8. A method, comprising:
    accessing, responsive to executing a boot sequence, at a controller a first error code for data stored in memory cells of an array, wherein the data is sensitive data associated with a host operating system (OS);
    calculating on a sensing circuitry a second error code for the data, wherein an execution of a plurality of operations to calculate the second error code are distributed between an execution of a different plurality of operations;
    determining at the controller whether the first error code and the second error code are a same error code; and
    responsive to a determination that the first error code and the second error code are not the same error code performing a particular action,
    wherein performing the particular action includes performing an action from a group of actions comprising:
        halting further execution of instructions via the sensing circuitry;
        launching execution of a different number of instructions executable using the sensing circuitry; and
        continuing to monitor the sensitive data.

9. The method of claim 8, wherein the sensitive data comprises sensitive data selected from a group including:
    passwords;
    documents; and
    files.

10. The method of claim 8, wherein the sensitive data comprises static machine executable instructions.

11. The method of claim 10, wherein the static machine executable instructions are executable by a host and the sensing circuitry.

12. The method of claim 10, wherein the sensitive data comprises at least portions of the host OS.

13. The method of claim 12, wherein the portions of the host OS comprise portions from a group including:
    network services;
    a task manager;
    a memory management unit; and
    a core.

14. An apparatus comprising:
an array of memory cells that are coupled to sense lines and that store data;
a controller configured to:
refresh the data stored in the array of memory cells; and
control sensing circuitry;
the sensing circuitry coupled to the sense lines and configured to:
   store, responsive to executing a boot sequence, the data in a sense amplifier as part of the refresh, wherein the data is sensitive data associated with a host operating system (OS);
   calculate a first error code for the data; and
   compare the first error code with a second error code for the data to determine whether the data has been modified;
wherein the controller is further configured to, responsive to a determination that the data has been modified, performing a particular action wherein performing the particular action includes performing an action selected from a group of actions including:
halting further execution of instructions via the sensing circuitry;
launching execution of a different number of instructions executable using the sensing circuitry; and
continuing to monitor the sensitive data.

15. The apparatus of claim 14, wherein the controller is configured to calculate the first error code and compare the first error code with the second error code to refresh the data.

16. The apparatus of claim 14, wherein the data stored in the sense amplifier is used for refreshing the data and for comparing the first error code with the second error code.

17. The apparatus of claim 14, wherein the controller is configured to determine whether the data stored in the sense amplifier is stored in memory cells within a memory address range.

18. The apparatus of claim 17, wherein the sensing circuitry is controlled to calculate the first error code for the data and compare the first error code with the second error code based on a determination that the data stored in the sense amplifier initiated in memory cells that have the memory address that falls within the memory address range.

19. The apparatus of claim 17, wherein a host provided the memory address range.

20. The apparatus of claim 14, wherein a host is configured to compare the first error code with the second error code at each refresh of the data.

* * * * *